United States Patent
Song

(10) Patent No.: US 7,122,401 B2
(45) Date of Patent: Oct. 17, 2006

(54) AREA ARRAY TYPE SEMICONDUCTOR PACKAGE FABRICATION METHOD

(75) Inventor: Chi-Jung Song, Daejon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 389 days.

(21) Appl. No.: 09/970,876

(22) Filed: Oct. 5, 2001

(65) Prior Publication Data

US 2002/0038904 A1 Apr. 4, 2002

Related U.S. Application Data

(62) Division of application No. 09/200,937, filed on Nov. 30, 1998, now Pat. No. 6,316,837.

(30) Foreign Application Priority Data

Dec. 4, 1997 (KR) .............................. 97-65912

(51) Int. Cl.
| | |
|---|---|
| *H01L 21/44* | (2006.01) |
| *H01L 21/48* | (2006.01) |
| *H01L 21/50* | (2006.01) |
| *H01L 23/495* | (2006.01) |
| *H01L 23/48* | (2006.01) |

(52) U.S. Cl. ................ 438/108; 438/106; 438/111; 438/112; 438/118; 438/119; 438/123; 438/124; 438/125; 438/126; 438/127; 438/613; 257/667; 257/668; 257/669; 257/670; 257/671; 257/673; 257/674; 257/676; 257/773; 257/778; 257/787

(58) Field of Classification Search ................ 438/106, 438/118, 119, 123, 613, 108, 124–127, 111–112; 257/667–671, 673–674, 676, 773, 778, 787

See application file for complete search history.

(56) References Cited

U.S. PATENT DOCUMENTS

| | | | | |
|---|---|---|---|---|
| 5,053,852 A | * | 10/1991 | Biswas et al. | 257/690 |
| 5,157,480 A | * | 10/1992 | McShane et al. | 257/693 |
| 5,182,631 A | * | 1/1993 | Tomimuro et al. | 257/664 |
| 5,197,183 A | * | 3/1993 | Chia et al. | 29/827 |
| 5,241,133 A | | 8/1993 | Mullen, III et al. | 174/52.4 |
| 5,253,010 A | * | 10/1993 | Oku et al. | 396/542 |
| 5,343,076 A | * | 8/1994 | Katayama et al. | 257/717 |
| 5,348,214 A | * | 9/1994 | Nishiguchi et al. | 228/180.22 |
| 5,355,283 A | | 10/1994 | Marrs et al. | 361/760 |
| 5,387,554 A | * | 2/1995 | Liang | 29/827 |
| 5,666,003 A | * | 9/1997 | Shibata et al. | 257/796 |
| 5,703,406 A | * | 12/1997 | Kang | 257/778 |
| 5,767,573 A | * | 6/1998 | Noda et al. | 257/675 |
| 5,790,378 A | * | 8/1998 | Chillara | 361/719 |
| 5,817,540 A | * | 10/1998 | Wark | 438/107 |
| 5,834,831 A | | 11/1998 | Kubota et al. | 257/676 |

(Continued)

*Primary Examiner*—Amir Zarabian
*Assistant Examiner*—Ida M. Soward
(74) *Attorney, Agent, or Firm*—Fleshner & Kim, LLP

(57) ABSTRACT

An area array type semiconductor package includes a plurality of conductive media such as solder bumps or solder balls, attached to respective bond pads of a chip. The conductive media act as external output terminals. The chip is attached to a lead frame by a thermal conductive adhesive, and a predetermined area of the lead frame and the semiconductor chip are packaged with a molding resin. Leads of the lead frame are then trimmed and formed so that the lead frame, to which the semiconductor chip is adhered, acts as a heat sink. This allows the package to be used for a high-powered semiconductor device which radiates a high temperature heat. Also, because conductive media such as solder bumps or solder balls can be used to directly connect bond pads of the chip to conductive regions of a circuit board, a size of the semiconductor package can be minimized, the arrangement of the bonding pads on the chip can be easily planned, and electrical characteristics of the semiconductor package can be improved.

25 Claims, 4 Drawing Sheets

U.S. PATENT DOCUMENTS

| | | | | |
|---|---|---|---|---|
| 5,835,988 A | * | 11/1998 | Ishii | 257/684 |
| 5,869,883 A | * | 2/1999 | Mehringer et al. | 257/667 |
| 5,883,439 A | * | 3/1999 | Saitoh | 257/787 |
| 5,886,404 A | * | 3/1999 | You | 257/692 |
| 5,923,954 A | * | 7/1999 | Cho | 438/108 |
| 5,963,796 A | * | 10/1999 | Kim | 438/125 |
| 5,965,936 A | | 10/1999 | Stave | 257/666 |
| 5,989,940 A | * | 11/1999 | Nakajima | 438/127 |
| 5,990,563 A | * | 11/1999 | Kim | 257/778 |
| 6,232,213 B1 | * | 5/2001 | King et al. | 438/613 |
| 6,277,670 B1 | * | 8/2001 | You | 438/106 |
| 6,374,675 B1 | * | 4/2002 | DePetrillo | 73/610 |
| 6,566,164 B1 | * | 5/2003 | Glenn et al. | 438/107 |
| 2001/0013645 A1 | * | 8/2001 | King et al. | 257/678 |
| 2001/0054752 A1 | * | 12/2001 | Woodworth et al. | 257/676 |
| 2002/0005571 A1 | * | 1/2002 | Jiang et al. | 257/666 |
| 2002/0031865 A1 | * | 3/2002 | Chen et al. | 438/123 |
| 2003/0160321 A1 | * | 8/2003 | Cloud et al. | 257/724 |

* cited by examiner

AREA ARRAY TYPE SEMICONDUCTOR PACKAGE FABRICATION METHOD

RELATED APPLICATIONS

This is a divisional application of application Ser. No. 09/200,937, filed Nov. 30, 1998, now U.S. Pat. No. 6,316,837.

BACKGROUND OF THE INVENTION

1. Field of the Invention

The present invention relates to a chip package, and more particularly, to a chip package having a lead frame serving as a heat sink. The invention also relates to a method of forming the chip package.

2. Background of the Related Art

A ball grid array (BGA) semiconductor package is widely used since the package is capable of having a large number of pins in a predetermined area. Also, the external terminals of the device are short, which helps to prevent them from being bent. Such a semiconductor package may be quickly mounted on a mother board through a reflow process, thereby reducing a manufacturing time.

As shown in FIG. 1, a background art BGA semiconductor package includes a printed circuit board (PCB) 1 having a plurality of metal patterns (not illustrated) formed therethrough. A semiconductor chip 2 having a plurality of bonding pads (not illustrated) is adhered on the PCB 1 by an adhesive 1a. Metal wires 3 electrically connect each bonding pad with a corresponding metal pattern in the PCB, and a molding epoxy 4 molds a predetermined area on the PCB 1 including the semiconductor chip 2 and the metal wire 3. A plurality of solder balls 5, which serve as external terminals, are adhered on the lower surface of the PCB 1. The metal patterns provide an electric path through the PCB to electrically connect the wires 3 on the upper side to the solder balls 5 on the lower side of the PCB 1.

FIG. 2 is a flow chart illustrating steps of a fabrication method for a background art BGA semiconductor package. As shown therein, the process includes: a sawing process for dividing a plurality of semiconductor devices which are formed in a wafer into individual semiconductor chips. Next, a die bonding process is performed to attach individual semiconductor chips on a PCB. A wire bonding process is performed for connecting a plurality of bonding pads of each semiconductor chip to a plurality of metal patterns of the PCB with a plurality of wires. Next, a molding process is performed to mold a predetermined area formed on the PCB, including the semiconductor chip and the wires with a molding epoxy. Finally, a ball bonding process is performed to bond solder balls on a lower surface of the PCB to serve as external output terminals.

Since the solder balls of the above-described BGA semiconductor package are located opposite to an active surface of the semiconductor chip (i.e., the upper surface of the semiconductor chip having bond pads), there is a limitation on the minimum size of the semiconductor package due to the height necessary to allow the wires to bend from the top of the chip down to the PCB.

Also, heat generated in the semiconductor chip is not effectively radiated outside the package. Accordingly, such a package is not suitable for a high-powered semiconductor device.

SUMMARY OF THE INVENTION

It is an object of the present invention to solve the problems and disadvantages of the related art.

It is another object of the present invention to more efficiently radiate heat.

It is a further object of the invention to enable a lead frame to serve as a heat sink.

A further object of the present invention is to provide a packaging for a high-powered semiconductor device which radiates high temperature heat.

To achieve the above objects, a fabrication method for an area array type semiconductor package embodying the invention, includes the steps of forming solder bumps on bonding pads of a semiconductor chip, bonding said semiconductor chip to a lead frame; packaging a predetermined area of the lead frame and the semiconductor chip with a molding resin, and trimming and forming said lead frame.

The lead frame may include a plurality of die paddles which are attached to a corresponding plurality of semiconductor chips by a thermal conductive adhesive. A plurality of leads are attached to each of the die paddles at a certain interval and serve to radiate heat to an exterior of the package.

In a chip package embodying the invention, a chip is attached to a lead frame having a plurality of leads. A plurality of conductive media are formed on bond pads of the chip. A molding resin packages portions of the chip and the lead frame.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
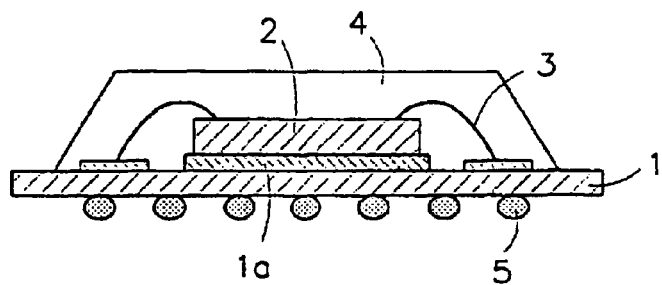
FIG. 1 is a vertical cross-sectional view illustrating a background art ball grid array semiconductor package.
Figure 2:
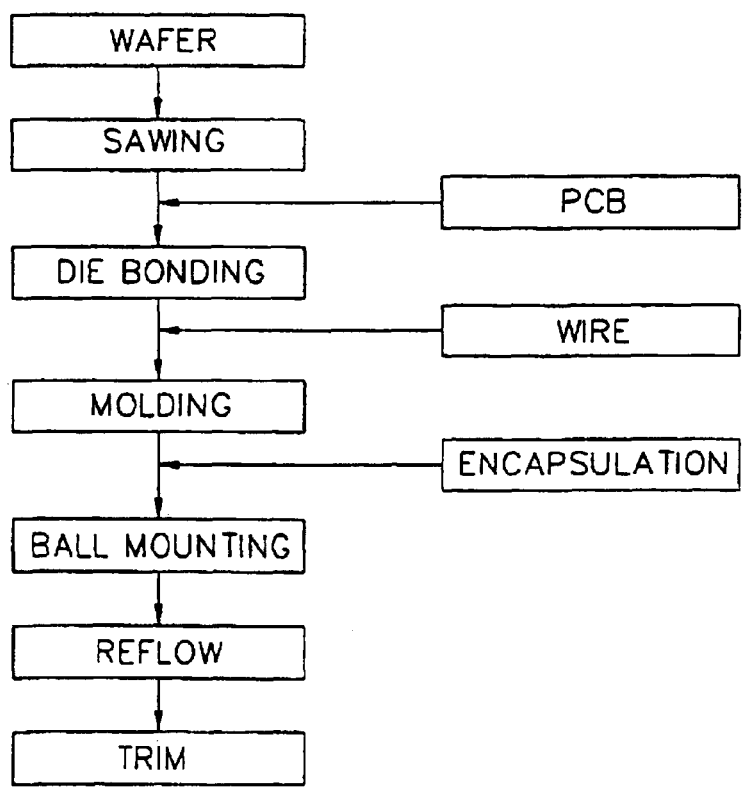
FIG. 2 is a flow chart illustrating a background art fabrication method for the ball grid array semiconductor package shown in FIG. 1.
Figure 3:
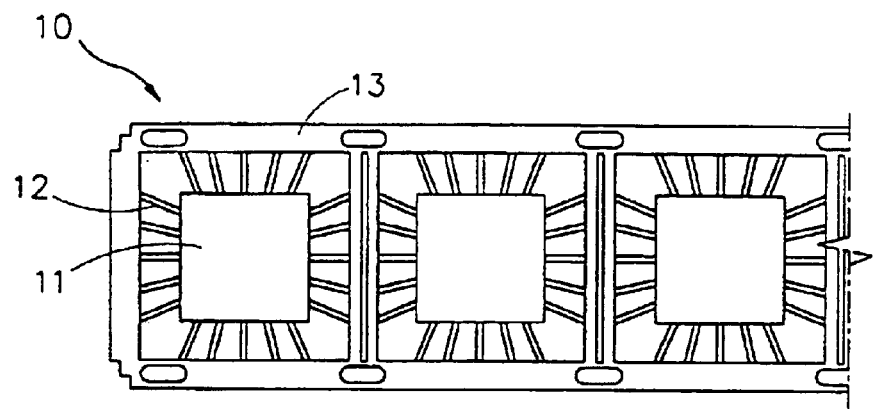
FIG. 3 is a plan view illustrating a lead frame of an area array type semiconductor package according to the present invention.

FIG. 3 is a plan view illustrating a lead frame of an area array type semiconductor package according to the present invention. As shown therein, the lead frame 10 includes a plurality of square shaped die paddles 11, to which semiconductor chips are adhered. A plurality of leads 12 are attached to and extend away from each die paddle 11 at a certain interval. A lead supporting member 13 supports the plurality of leads 12. As can be appreciated, the lead frame 10 may be made of copper, a copper alloy, a tungsten alloy or any other suitable material. Each of the die paddles 11 may also have a hole, depression or dimple for receiving a chip.

Figure 4:
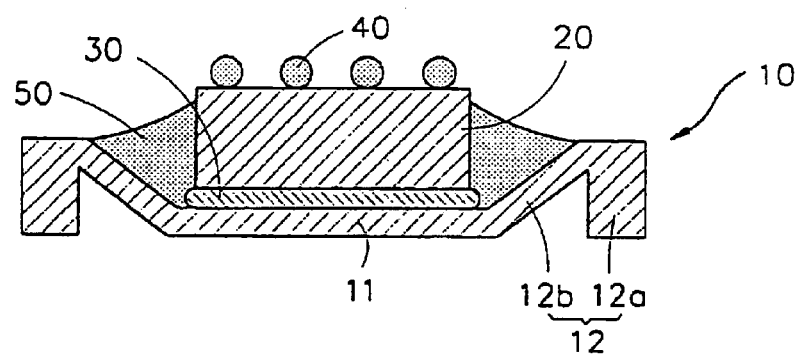
FIG. 4 is a vertical cross-sectional view of an area array type semiconductor package according to the present invention.

FIG. 4 is a cross-sectional view of an area array type semiconductor package according to the present invention which utilizes the lead frame shown in FIG. 3. As shown therein, the package includes a semiconductor chip 20, having a plurality of bonding pads (not illustrated) thereon. The chip 20 is attached to the paddle 11 via a thermal conductive adhesive 30. A plurality of conductive media such as solder bumps or solder balls 40, which serve as external output terminals, are formed on respective bonding pads of the semiconductor chip 20. A molding resin 50 covers portions of the semiconductor chip 20 and lead frame 11. In the above-described semiconductor package, the lead frame 10 operates as a heat sink which radiates heat generated by the semiconductor chip 20. Preferably, a thermal conductive epoxy is used as the adhesive 30.

Figure 5A:
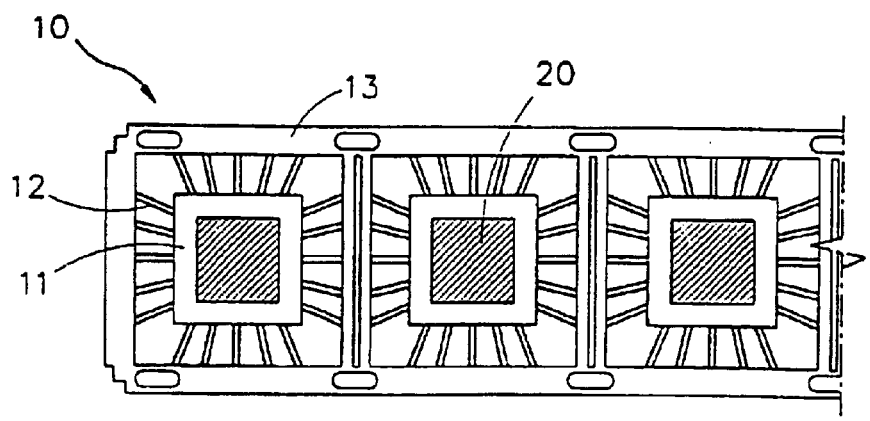
FIGS. 5A to 5E are plan and cross-sectional views illustrating the results of steps of a fabrication method for the area array type semiconductor package according to the present invention.
Figure 5B:
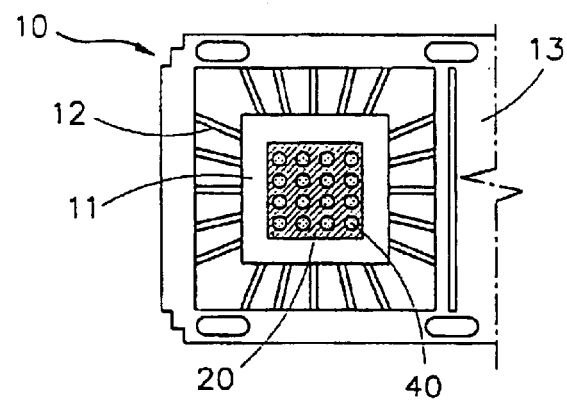

FIGS. 5A to 5E show the results of steps of a fabrication method for an area array type semiconductor package according to the present invention. As shown in FIGS. 5A and 5B, a semiconductor chip 20 is first adhered to a die paddle 11 of the lead frame 10 using an adhesive 30. A plurality of conductive media 40 are then formed on bond pads of the semiconductor chip 20. Of course, the conductive media 40 could be formed on the chip 20 before the chip 20 is bonded to the die paddle 11.

Figure 5C:
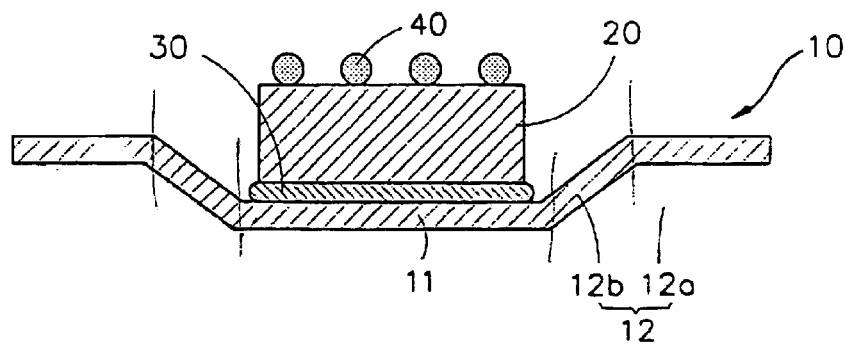
Figure 5D:
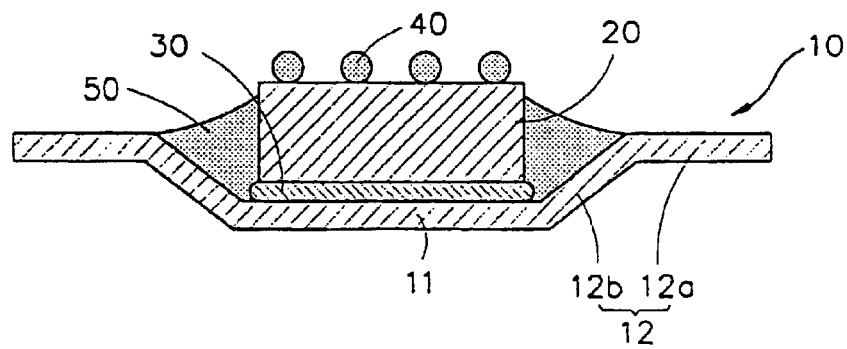
Figure 5E:
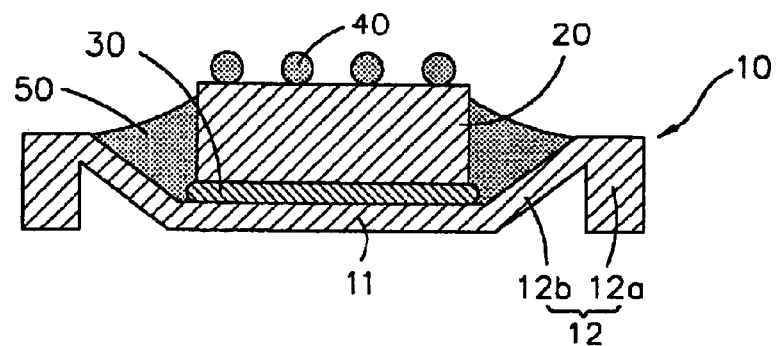

Next as shown in FIGS. 5C and 5D, a predetermined area formed on the lead frame 10, including the semiconductor chip 20, is packaged with a molding epoxy 50. The conductive media 40 formed on the bonding pads of the above semiconductor chip 20 are externally exposed. Each lead 12 of the lead frame is divided into two parts, an outer lead 12a which is externally exposed and an inner lead 12b which is at least partially packaged by the molding epoxy 50. As shown in FIG. 5E, the exposed outer lead 12a is then trimmed and formed, thus completing an area array type semiconductor package according to the present invention.

Figure 6:
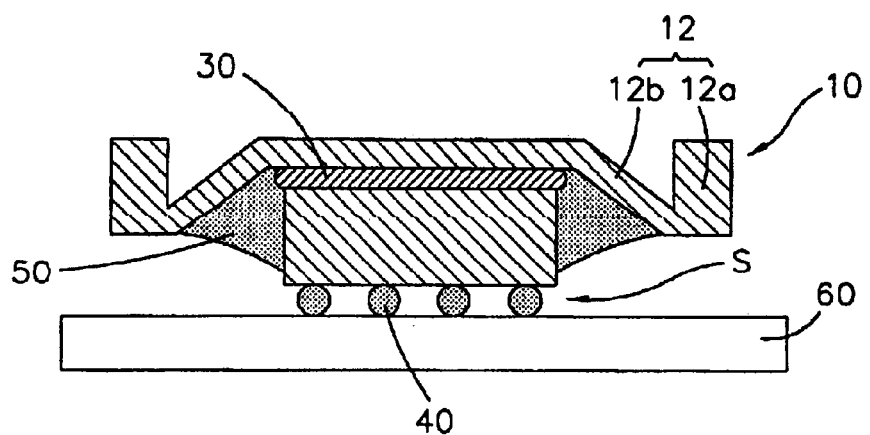
FIG. 6 is a cross-sectional view illustrating an area array type semiconductor package according to the present invention mounted on a printed circuit board.

FIG. 6 illustrates how an area array type semiconductor package according to the present invention is mounted on a printed circuit board (PCB) 60 using the conductive media 40, preferably, solder balls. A reflow process can be used to attach the conductive media 40 to conductive pads on the PCB 60.

Figure 7:
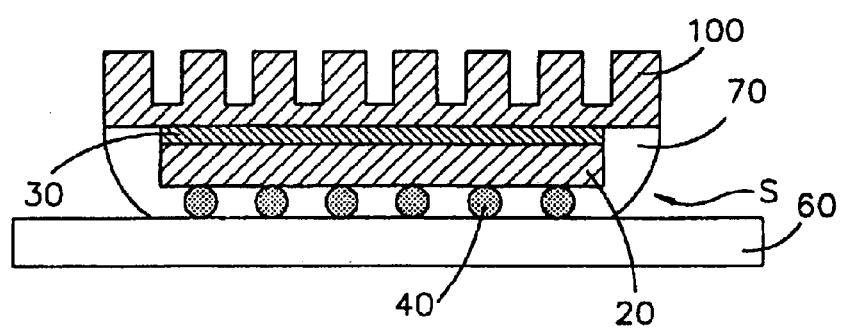
FIG. 7 is a cross-sectional view illustrating an alternate embodiment of an area array type semiconductor package according to the present invention mounted on the printed circuit board.

In an alternate embodiment, as shown in FIG. 7, the space S between the chip 20 and the PCB 60 may be filled with a molding compound 70, or any other suitable material, as is well known to those skilled in the art. Also, in the embodiment shown in FIG. 7, a plurality of cooling fins 100 extend away from the top surface of the lead frame 10.

As described above, an area array type semiconductor package according to the present invention uses a lead frame, to which the semiconductor chip is bonded, as a heat sink. This allows the package to be used for a high-powered semiconductor device which radiates heat at a high temperature.

Also, unlike the background art semiconductor package which communicates with bond pads of a chip through metal wires and conductive regions passing through a PCB, the area array type semiconductor package according to the present invention includes conductive media such as solder bumps or solder balls directly attached to the bond pads of a chip. The conductive media act as external output terminals. This configuration allows the dimensions of the semiconductor package to be minimized. Also, the bonding pad arrangement can easily be planned, and electrical characteristics of the semiconductor package can be improved. In addition, because the space between the semiconductor chip and the PCB can be underfilled with a molding compound or resin, a reliability of the solder joint can be improved.

The foregoing embodiments are merely exemplary and are not to be construed as limiting the present invention. The present teaching can be readily applied to other types of apparatus. Many alternatives, modifications, and variations will be apparent to those skilled in the art. In the claims, means-plus-function clauses are intended to cover the structures described herein as performing the recited function and not only structural equivalents but also equivalent structures. For example, although a wire and a solder ball may not be structural equivalents in that a wire can be routed in various ways over a substantial distance to electrically connect two elements, whereas a solder bump must be sandwiched between the elements being connected, in the environment of making electrical connections, a wire and a solder bump may be equivalent structures.

What is claimed is:

1. A method for fabricating a chip package, comprising:
   attaching a chip which has a plurality of bonding pads on an active surface of the chip directly onto a die paddle of a lead frame using an adhesive, wherein a plurality of leads are attached to and extend from the die paddle;
   forming a plurality of conductive media on said bonding pads; and
   molding a predetermined area on the lead frame, including a plurality of surfaces of said chip, with a molding resin such that the plurality of conductive media, and a portion of the leads are exposed.

2. The method of claim 1, further comprising bending portions of the leads of the lead frame in an upward or downward direction.

3. The method of claim 1, wherein the attaching step comprises attaching the chip to the die paddle of the lead frame with a thermal conductive adhesive.

4. The method of claim 3, wherein the die paddle area of the lead frame has an area that is larger than an attachment area of the chip.

5. The method of claim 3, further comprising bending a portion of said die paddle.

6. The method of claim 1, wherein the die paddle area of the lead frame has a size that is substantially the same as an attachment area of the chip.

7. A method of forming a chip package and attaching the chip package to a circuit board, comprising:
   attaching a first side of a chip to a die paddle of a lead frame having a plurality of leads;
   attaching a plurality of solder bumps or balls directly to bond pads on an opposing second side of the chip;
   packaging portions of the lead frame and the chip with a molding resin so that the plurality of solder bumps or balls and external portions of the leads are exposed; and
   bonding the plurality of solder bumps or balls to a circuit board such that the plurality of solder bumps or balls electrically connect the bond pads of the chip to pads of the circuit board.

8. The method of claim 7, further comprising filling a gap between the chip and the circuit board with a resin.

9. The method of claim 7, further comprising bending portions of the leads.

10. The method of claim 7, wherein the attaching the chip to the lead frame comprises attaching the chip to the lead frame with a thermally conductive adhesive.

11. A method of forming a chip package, comprising:
attaching a first side of a chip to a die paddle of a lead frame having a plurality of leads;
attaching conductive media to an active side of the chip without the use of bonding wires, wherein the active side opposes the first side; and
applying a molding material to the lead frame and the chip leaving the conductive media and a portion of the leads free from contact with the molding material.

12. The method of claim 11, wherein applying the molding material to the frame and the chip comprises applying a molding resin to the frame and the chip.

13. The method of claim 11, wherein applying the molding material to the frame and the chip comprises applying epoxy to the frame and the chip.

14. The method of claim 11, further comprising exposing the conductive media and portions of the frame outside of the molding material.

15. The method of claim 11, wherein attaching the chip to the frame comprises attaching the chip to a lead frame.

16. The method of claim 15, wherein attaching the chip to the lead frame comprises attaching the chip onto a die paddle area of the lead frame.

17. The method of claim 16, wherein the die paddle area of the lead frame has an attachment area larger than or substantially equal to an attachment area of the chip.

18. The method of claim 11, further comprising bending a portion of the frame.

19. The method of claim 11, wherein the attaching the chip to the frame comprises attaching the chip to a frame with a plurality of protrusions.

20. The method of claim 1, wherein the lead frame is metallic.

21. The method of claim 1, wherein the lead frame comprises at least one of copper, copper alloy and tungsten alloy.

22. The method of claim 7, wherein the lead frame is metallic.

23. The method of claim 7, wherein the lead frame comprises at least one of copper, copper alloy and tungsten alloy.

24. The method of claim 11, wherein the frame is metallic.

25. The method of claim 11, wherein the frame comprises at least one of copper, copper alloy and tungsten alloy.

* * * * *